US006187679B1

(12) United States Patent
Cabral, Jr. et al.

(10) Patent No.: US 6,187,679 B1
(45) Date of Patent: Feb. 13, 2001

(54) LOW TEMPERATURE FORMATION OF LOW RESISTIVITY TITANIUM SILICIDE

(75) Inventors: Cyril Cabral, Jr., Ossining; Lawrence Alfred Clevenger, Lagrangeville; Francois Max d'Heurle, Ossining; James McKell Edwin Harper, Yorktown Heights, all of NY (US); Randy William Mann, Jericho, VT (US); Glen Lester Miles, Essex Junction, VT (US); James Spiros Nakos, Essex, VT (US); Ronnen Andrew Roy, Briarcliff Manor; Katherine L. Saenger, Ossining, both of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 08/807,739

(22) Filed: Feb. 26, 1997

Related U.S. Application Data

(60) Division of application No. 08/586,046, filed on Jan. 16, 1996, now Pat. No. 5,828,131, and a continuation-in-part of application No. 08/145,921, filed on Oct. 29, 1993, now Pat. No. 5,510,295.

(51) Int. Cl.[7] ................................................. H01L 21/44
(52) U.S. Cl. ........................... 438/682; 438/683; 438/660
(58) Field of Search ..................................... 438/683, 682, 438/660, 658, 649, 651, 655, 656, 650

(56) References Cited

U.S. PATENT DOCUMENTS 5,880,505 * 3/1999 Fujii et al. ............................ 257/383
6,022,801 * 2/2000 Domenicucci et al. ............. 438/653

OTHER PUBLICATIONS

Y. Dao, et al. "Structural and Electronic Properties of (Ti0.9Zr0.1)Si2 thin films on Si(111)", Applied Physics Letters, vol. 65, No. 19, pp. 2413–2415, Nov. 1994.*

Y. Dao, et al. "Phase Stabilities and Surface Morphologies of (ti1–xZrx)Si2 thin films on Si(100)", Journal of Applied Physics, vol. 78, No. 11, pp. 6564–6591, Nov. 1994.*

* cited by examiner

Primary Examiner—Caridad Everhart
(74) Attorney, Agent, or Firm—Heslin & Rothenberg, P.C.

(57) ABSTRACT

Low resistivity titanium silicide, and semiconductor devices incorporating the same, may be formed by titanium alloy comprising titanium and 1–20 atomic percent refractory metal deposited in a layer overlying a silicon substrate, the substrate is then heated to a temperature sufficient to substantially form C54 phase titanium silicide. The titanium alloy may further comprise silicon and the refractory metal may be Mo, W, Ta, Nb, V, or Cr, and more preferably is Ta or Nb. The heating step used to form the low resistivity titanium silicide is performed at a temperature less than 900° C., and more preferably between about 600–700° C.

14 Claims, 13 Drawing Sheets

LOW TEMPERATURE FORMATION OF LOW RESISTIVITY TITANIUM SILICIDE

CROSS-REFERENCE TO RELATED APPLICATIONS

This application is a division of application Ser. No. 08/586,046 filed Jan. 16, 1996 which application is now U.S. Pat. No. 5,828,131. This application is a continuation-in-part of U.S. patent application Ser. No. 08/145,921 filed Oct. 29, 1993 now U.S. Pat. No. 5,510,295.

FIELD OF THE INVENTION

The present invention relates to integrated circuit devices and, more particularly, to a method for forming a titanium silicide layer overlying a silicon layer in an integrated circuit device where the phase transformation temperature of the titanium silicide has been reduced by the use of a refractory metal.

DESCRIPTION OF THE PRIOR ART

Titanium silicide has become the most widely-used silicide in the VLSI industry for self-aligned silicide applications because of its combined characteristics of low resistivity, the ability to be self-aligned, and relatively good thermal stability. Although $TiSi_2$ has certain advantages relative to other silicides, the fact that it is a polymorphic material presents additional problems in its use. Specifically, in typical use $TiSi_2$ exists as either an orthorhombic base-centered phase having 12 atoms per unit cell and a resistivity of about 60–90 micro-ohm-cm (known in the industry as the C49 phase), or as a more thermodynamically-favored orthorhombic face-centered phase which has 24 atoms per unit cell and a resistivity of about 12–20 micro-ohm-cm (known as the C54 phase). When using the generally-accepted processing conditions for forming titanium silicide, the less-desirable, higher-resistivity C49 phase is formed first. In order to obtain the lower-resistivity C54 phase, a second high-temperature annealing step is required. This second step is disadvantageous because it can have detrimental effects on the silicide and other integrated circuit elements, especially at smaller line-widths. For example, the increasing use of dual-doped polysilicon gate structures in some devices has increased their sensitivity to additional heat cycles, as is required by the second anneal step. Also, silicon nitride peeling and cracking have been associated with the second annealing step.

The generally accepted set of processing conditions for forming titanium silicide includes: (1) pre-cleaning, (2) titanium deposition, (3) silicide formation at a temperature less than about 700° C., (4) selective etching, and (5) a phase transformation anneal at a temperature greater than about 700° C. It is the phase transformation anneal that converts the dominant C49 phase to the C54 phase. The initial formation temperature is kept below 700° C. in order to minimize over-spacer bridging. The second transformation anneal is performed after any un-reacted titanium has been selectively removed and is generally performed at temperatures of 50–200° C. above the formation temperature to insure full transformation to the C54 phase for best control of sheet resistance. However, as device line-widths and silicide film thicknesses continue to be scaled down, it becomes ever more desirable to eliminate the need for this second anneal step, as discussed further below.

It is generally accepted that the C49 phase forms first because of a lower surface energy than that of the C54 phase. In other words, the higher surface energy of the C54 phase forms a higher energy barrier to its formation. The second transformation anneal step used in the standard process above provides the additional thermal energy necessary both to overcome the nucleation barrier associated with forming the new surface and to grow the crystalline structure of the newly-forming C54 phase. In VLSI applications, if the phase transformation is inhibited or fails to occur uniformly, a degradation in circuit performance is observed. In some higher-performance circuits, the RC delay associated with a poor phase transformation is typically about 5–10 percent.

A significant limitation on the C49-to-C54 phase transformation is a phenomenon known as agglomeration. If the thermal energy used to obtain the phase transformation is excessive, then a morphological degradation of the titanium silicide results, which is commonly referred to as agglomeration. As line-widths and silicide film thicknesses decrease, the thermal energy required to effect the C49-to-C54 phase transformation increases, yet the thermal energy level at which the silicide film starts to agglomerate decreases. Thus, there is an ever-shrinking process window for performing this phase transformation, making process control and uniformity more difficult to achieve.

Thus, there is a need for an improved method for forming the C54 phase of titanium silicide without requiring a second high-temperature annealing step, as in the generally-accepted process above. Eliminating the second annealing step or reducing the temperature necessary to transform the C49 phase to the desired C54 phase titanium silicide would reduce the problems associated with high temperature processing and the limitations resulting from agglomeration of silicide films during the phase transformation anneal.

SUMMARY OF THE INVENTION

This need is satisfied, the limitations of the prior art overcome, and other benefits realized in accordance with the principles of the present invention by a method for forming a metal silicide overlying a silicon layer on a semiconductor wafer. The method includes forming a titanium silicide layer on a silicon substrate of a semiconductor device, comprising: (1) depositing a titanium alloy layer over a silicon substrate wherein the titanium alloy comprises from 1 to 20 atomic percent refractory metal; and (2) heating the titanium alloy to a temperature sufficient to substantially form C54 phase titanium silicide from the titanium alloy. This temperature may be less than about 700° C.

In one application of the above method the titanium alloy may comprise from 1 to 15 atomic percent refractory metal and the refractory metal may comprise one or more of the group consisting of Ta, Nb, Mo, W, V and Cr. The titanium alloy may comprise titanium, silicon and a refractory metal; an example being $TiSi_2$ and a refractory metal. The semiconductor substrate may be selected from monocrystalline silicon, polycrystalline silicon, amorphous silicon, a silicon germanium alloy, silicon on insulator containing N-type dopant and silicon on insulator containing P-type dopant. The titanium alloy may be deposited over the silicon substrate by physical vapor deposition or chemical vapor deposition.

Another aspect of the invention includes a semiconductor device having a C54 phase titanium silicide layer comprising: (1) a silicon layer; and (2) a layer of titanium silicide over said silicon layer wherein said layer titanium silicide comprises substantially C54 phase titanium silicide and from 1 to 20 atomic percent refractory metal. A further aspect of the semiconductor device of the present invention includes a silicon layer selected from the group of monocrystalline silicon, polycrystalline silicon, amorphous silicon, silicon germanium alloy, silicon on insulator having N-type dopant and silicon on insulator having P-type dopant. The semiconductor device of the present invention may include titanium silicide layer comprising from 1 to 15 atomic percent refractory metal and a thickness of between 10 to 200 nm.

DESCRIPTION OF THE INVENTION

Figure 1:
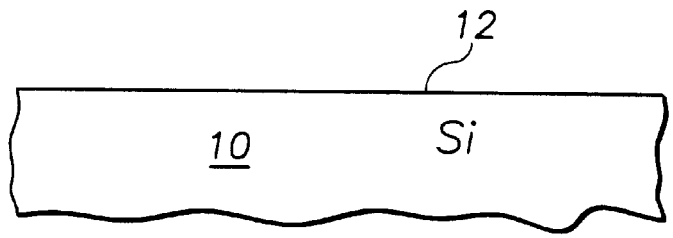
FIGS. 1–3 are cross-sections illustrating the formation of the C54 phase of titanium silicide in accordance with one aspect of the present invention.

According to one embodiment of the present invention, a refractory metal is disposed proximate to the surface of the silicon layer, a titanium metal layer (later used to form the titanium silicide) is deposited overlying the refractory metal, and the wafer is heated to a temperature sufficient to form titanium silicide.

In a second embodiment, the titanium metal layer may also incorporate silicon, as for example in the known polycide process. When the titanium metal layer incorporates silicon, the final titanium silicide is obtained by heating the wafer to a temperature sufficient to obtain the desired solid phase following deposition of the Ti-silicon alloy (which in some cases may be stoichiometric). In addition to Si, the precursor metal layer may incorporate other elements from periodic table Groups IIB, IIIA, IVA, VA, and VIA, including B, C, N, O, Al, P , S, Zn, Ga, Ge, As, Se, Cd, In, Sn, Sb, Te, Hg, Ti, Pb and Bi.

The refractory metal is preferably a metal that is capable of forming a metal silicide and the concentration of the refractory metal at the surface of the silicon layer is preferably more than about $10^{17}$ atoms/cm$^3$. The refractory metal may be Mo, W, Ta, Nb, V, or Cr. The silicon layer may be monocrystalline or polycrystalline, but is preferably polycrystalline. The heating step used to form the silicide is performed at a temperature less than about 700° C., and more preferably between about 600–700° C.

There are several approaches for disposing the refractory metal that may be used. In general, these methods of disposition place refractory metal atoms on or within a few Angstroms of the surface, for example within about 2 Angstroms. A first approach for disposing the refractory metal is by ion implantation with a dose of about $10^{12}$ to $5\times10^{14}$ atoms/cm$^2$, and more preferably a dose of about $10^{13}$ to $10^{14}$ atoms/cm$^2$. The preferred implant energy is about 15 to 90 KeV. In another approach, the refractory metal is disposed on the surface of the silicon layer by evaporation of, say, a metal pellet. Also, the refractory metal may be disposed by sputtering or by exposing the surface of the silicon layer to a solution containing ions of the refractory metal. For example, the solution may be a dilute acid solution containing HCl or nitric acid. Under all of the above disposition approaches except implantation, the thickness of the disposed refractory metal layer on the silicon surface is preferably less than about 2.0 nm, and more preferably about 0.01 to 1.5 nm.

Optionally, the wafer is annealed following the step of disposing the refractory metal and prior to the step of depositing the precursory metal layer. Preferably, this annealing step is performed at a wafer temperature of at least about 900° C., and more preferably between about 900 and 1000° C. In one approach. This annealing is performed for at least about 5 seconds using rapid thermal annealing (RTA). Alternatively, annealing in a furnace for at least about 10 minutes may be used.

In another approach to the present invention, a titanium silicide layer is formed overlying a silicon layer on a semiconductor wafer. According to this approach, a refractory metal is disposed proximate to the surface of the silicon layer, a titanium layer is deposited overlying the refractory metal, and the wafer is heated to a temperature sufficient to form the titanium silicide layer at least in part from the titanium layer. Preferably, the titanium silicide layer formed during this heating step substantially exhibits the C54 phase of TiSi$_2$. Preferably, the titanium layer is deposited to a thickness of about 25–57.5 nm, and the TiSi$_2$ layer is formed at a temperature less than about 700° C., and more preferably about 600–700° C. Also, the refractory metal is preferably Mo, W, Ta, Nb, V, or W and is preferably disposed by either ion implantation or metal evaporation. It has been found that Mo, Ta and Nb give the best results, even relative to W. Ion implantation is preferably performed with an implant dose of about $10^{13}$ to $10^{14}$ atoms/cm$^2$. Preferably, the optional annealing step described above is performed.

In an alternative embodiment according to the present invention, a metal silicide is formed in a layer overlying a silicon layer on a semiconductor wafer by a method comprising the steps of depositing a titanium layer overlying the silicon layer, where the titanium layer contains a small quantity of a refractory metal, and heating the wafer to a temperature sufficient to form the titanium silicide. The phase transformation temperature of titanium silicide from C49 to C54 is lowered by the presence of said refractory metal at the surface of said silicon layer. Preferably, the titanium and the refractory metal are deposited during the same deposition process, and the atomic percentage of the refractory metal layer in the source is less than about 20 atomic percent, preferably between 1 and 15 atomic percent.

In a preferred approach according to the alternative embodiment, a titanium layer is deposited from a source of titanium which also contains a small quantity of a refractory metal. The wafer is then heated to a temperature sufficient to substantially form the C54 phase of titanium silicide. Preferably this temperature is less than about 700° C., and the atomic percentage of the refractory metal is less than about 20 atomic percent.

An advantage of the present invention is that a phase transformation annealing step is eliminated. For example, with respect to titanium silicide the desired C54 phase is substantially formed directly during the titanium silicide formation step. No second phase transformation anneal is required to transform the $TiSi_2$ from the C49 to the C54 phase. Also, agglomeration is essentially eliminated because the titanium silicide film is exposed to lower processing temperatures. As other advantages of the present invention, there is improved ability to control the microstructure of the final C54 phase of the suicide film, and the small grain size of the C54 phase grains may be less than the critical dimensions of the devices being fabricated.

In one embodiment a refractory metal is disposed proximate to the surface of the silicon layer, and a titanium layer is deposited over the refractory metal and the silicon surface. The wafer is then heated to a temperature of about 600 to 700° C. for a time period sufficient to form the C54 phase of titanium silicide.

More specifically, with reference to FIG. 1, a silicon layer 10 which may be a monocrystalline silicon wafer (100) or polycrystalline silicon, is provided. Silicon layer 10 may be, for example, a polycrystalline N or P-type line or a monocrystalline N or P-type region. The refractory metal is disposed either on or near a top surface 12 of silicon layer 10, depending in part on the manner in which the metal is disposed. It is believed that the refractory metal acts to lower the surface energy barrier for the formation of the C54 phase of $TiSi_2$, and therefore, that the presence of the refractory metal at or near the surface promotes the formation of the C54 phase. It is believed that a refractory metal-silicon alloy is formed near top surface 12. It is not known with certainty whether this is a metal-silicon complex or a metal-silicon compound. In general, some of the disposed refractory metal should be on or within a few Angstroms of top surface 12. Of course, the exact disposition of the refractory metal atoms will depend upon the manner of disposition. However, for purposes of this application each manner of disposition described herein is considered to dispose refractory metal atoms proximate to the silicon surface.

Figure 2:
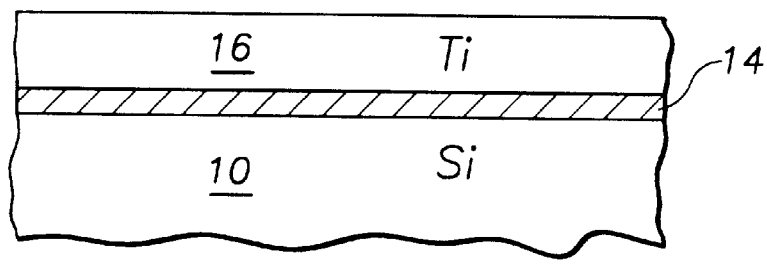

Referring now to FIG. 2, a refractory metal 14 is shown proximate to the surface of silicon layer 10. First, it should be appreciated that FIG. 2 is for illustrative purposes only and that refractory metal 14 will not necessarily cover all of top surface 12. Second, it should be noted that distribution of refractory metal 14 will vary also depending upon the manner of disposition. For example, if refractory metal 14 is disposed by ion implantation, then most of the metal will be below top surface 12. On the other hand, if the metal is disposed by evaporation, then most of the metal will be disposed on top surface 12, rather than underneath it. With both the ion implantation and evaporation approaches, it is believed that it is the concentration of the refractory metal proximate to top surface 12 that lowers the C54 phase surface energy barrier. After refractory metal 14 is disposed, then a titanium layer 16 is deposited over refractory metal 14 by, say, sputtering or evaporation. For example, a thickness of 25 to 57.5 nm is used, although one skilled in the art will recognize that greater and lesser thicknesses may also be used. Top surface 12 is not explicitly shown in FIG. 2 because its position will vary according to the manner of refractory metal disposition used.

In addition to sputtering or evaporation, titanium layer 16 may also be deposited over refractory metal 14 by chemical vapor deposition. Further, when deposited by one of these methods, instead of an essentially titanium layer, a layer containing an alloy of Ti and Si may be deposited. This alloy may be stoichiometric $TiSi_2$, but this is not required, and the Ti—Si alloy may be either rich or lean in its silicon composition. When a Ti—Si alloy is deposited, the method according to the present invention is substantially similar to that described herein. Any required modifications will be recognized by one of skill in the art. Also, as used herein, the deposition of a titanium layer may alternatively refer to the deposition of a titanium-silicon alloy layer.

Figure 3:
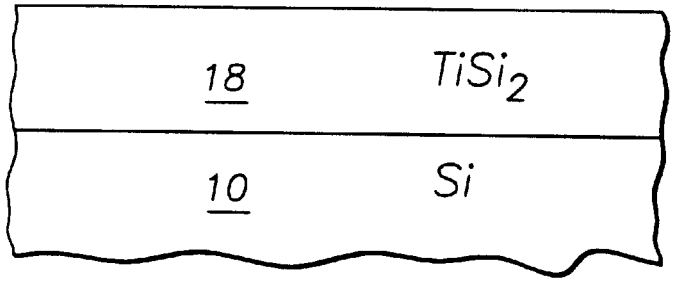

In FIG. 3, a $TiSi_2$ film 18 has been formed over silicon layer 10 by heating silicon layer 10 to a temperature between about 600 and 700° C. for a time period sufficient for the C54 phase of $TiSi_2$ to form. This time period is generally about 20 seconds for RTA to about 20 minutes for annealing in a conventional furnace. According to the method of the present invention, it is believed that the forming $TiSi_2$ film does not substantially pass through the C49 phase, but primarily goes directly to the C54 phase due to the lowered surface energy barrier.

An optional annealing step has been found beneficial for further promoting the formation of the C54 phase of $TiSi_2$, especially when forming the silicide at lower temperatures, say below about 650° C. This optional anneal is performed following the disposition of refractory metal 14 and prior to the deposition of Ti layer 16. In general, this anneal is performed at a wafer temperature of at least about 900° C., and more preferably 900–1000° C., for a time period of at least about 5 seconds when using RTA and of generally about 10–30 minutes when using a conventional quartz furnace. A preferred anneal is at a temperature of about 900° C. for about 10 minutes in a furnace in a $N_2$ ambient. It is believed that this optional anneal may further promote the formation of the refractory metal-silicon alloy at the surface of the silicon layer, though this is not certain.

In general, it is believed that the refractory metal according to the method of the present invention may be any metal capable of forming a metal silicide. For the purposes of this application, "refractory metal" is defined to include, without limitation, the following preferred metals: Mo, V, W, Ta, Nb, or Cr, Ta and Nb provide the most significant effect. It is believed that the above metals will in general work with any of the herein disclosed manners of disposition, but ion implantation and evaporation of Mo, Ta, and/or Nb are preferred approaches.

Discussing now the above silicidation process in greater detail, there are several approaches for disposing the refractory metal that may be used. In general, these methods of disposition place refractory metal atoms on or within a few Angstroms of top surface 12. It is believed that the refractory metal atoms closest to the silicon interface are most active, but other more distant atoms are not excluded from the meaning of proximate as used herein. For example, atoms within about 2 Angstroms (i.e. about 0.2 nm) of the surface may be the most active. A first approach for disposing the refractory metal is by ion implantation with a dose of about $10^{12}$ to $5\times10^4$ atoms/$cm^2$ and even more preferably a dose of about $10^{13}$ to $10^{14}$ atoms/$cm^2$. The preferred implant energy for these cases is about 15 to 90 KeV.

One way for implanting refractory metals involves the use of the arc chamber of commercially available ion implant systems. Because the arc chamber is commonly made from, or in other cases lined with, refractory metals (such as molybdenum, niobium, tantalum, or tungsten), one method of implanting these metals is accomplished by using the arc chamber as the source of the metal to be implanted. The metal species to be implanted is selected by appropriately varying the arc chamber material and by adjusting the magnetic analyzer to select the desired atomic mass unit (AMU) of the metal species based on the known isotopes of the desired species. For example, an appropriate setting is 98 AMU for Mo, or 184 for W. Because W is also a common filament material in the ion source filament of the implant tool, W can be alternatively implanted by adjusting the analyzer magnet to 184 AMU for singly-ionized W, or to 92 AMU for doubly-ionized W. The dose and energy selected for a particular metal species will be limited by the capabilities of the ion implant system and the time devoted to performing the implant.

For the specific case of a Mo implant, a Mo arc chamber is installed into the implant system, a boron trifluoride source gas ($BF_3$) is introduced into the arc chamber. It is believed that ionized $BF_3$ acts to volatilize molybdenum from the arc chamber to provide an adequate Mo ion (98 Mo+) beam current of about 200 mA with an implant energy of at least about 45 KeV. Because arc chambers sometimes become coated with other materials during use in other conventional applications, it is preferred that a clean or new source chamber be used to obtain the Mo ion beam current.

When implanting Mo atoms under the above conditions (i.e. an energy of 45 KeV), it has been determined that the greatest concentration of Mo atoms occurs at a depth in the silicon layer of about 30 nm, corresponding to a peak Mo concentration of about $10^{19}$ atoms/cm$^3$. However, as discussed above, the Mo atom concentration of greatest interest is that at the surface. When using the optional anneal step above, SIMS data has indicated that the concentration of Mo atoms at the surface is about $5 \times 10^{18}$ atoms/cm$^3$. It is expected that a surface concentration of the refractory metal at the silicon interface more than about $10^{17}$ atoms/cm$^3$ may be desirable.

In another approach, the refractory metal is disposed on the surface of the silicon layer by evaporation of, say, a metal pellet. This may be by either e-beam evaporation or by resistive heating (e.g. placing the pellet in a crucible that is heated by a large electrical current). When using evaporation, it is important that the thickness of the refractory metal not be too great. For example, the thickness of a Mo layer disposed on the silicon layer is preferably less than about 2.0 nm. This is not an absolute maximum thickness, but as the thickness of the Mo layer increases above 2.0 nm, peeling of the silicide film has been observed. More preferably, a Mo thickness of about 0.01 to 1.5 nm is used. The desired thicknesses for other metals may vary somewhat.

When evaporating such small thicknesses of refractory metal onto the silicon layer, it is sometimes difficult to control the rate of evaporation. As a result, in one evaporation approach a shutter is positioned over the evaporation metal source chamber to contain the refractory metal until ready for disposition on the silicon layer. Then, the shutter is opened and closed fairly rapidly (a so-called "flash" evaporation) to provide a thin refractory metal layer over the silicon layer. Other evaporation approaches could be used that better control the rate of evaporation.

As an alternative to evaporation of the refractory metal, the refractory metal may instead be disposed by sputtering to a thickness on the silicon layer similar to that described for evaporation above. Modifications used with a sputtering approach will be recognized by one skilled in the art.

In addition to the above, the refractory metal may be disposed on the silicon layer by exposing the surface of the silicon layer to a solution containing ions of the refractory metal. In a preferred approach, the solution is aqueous and may contain a dilute acid, such as HCl or nitric acid.

As for the $TiSi_2$ approach above, the wafer is optionally annealed following the step of disposing the refractory metal and prior to the step of depositing the titanium layer. Preferably, this annealing step is performed at a wafer temperature of at least about 900° C., and more preferably between about 900 and 1000° C.

Figure 4:
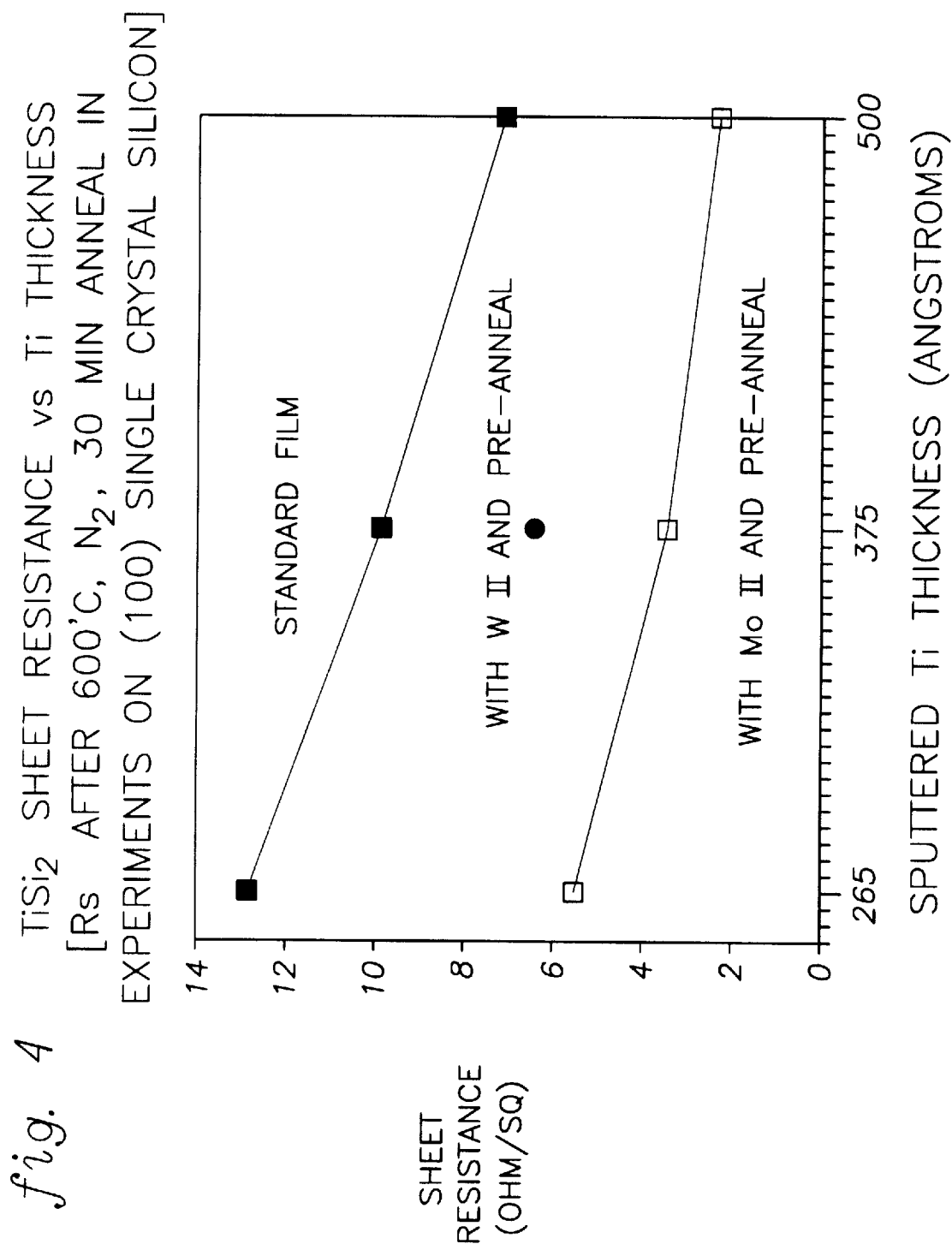
FIG. 4 is a graph of the sheet resistance of a titanium silicide layer versus sputtered titanium thickness for several process cases with and without the use of a refractory metal according to the present invention.

FIGS. 4–9 present experimental data for several $TiSi_2$ films formed according to the present invention. FIG. 4 is a graph of the sheet resistance of a titanium silicide layer versus sputtered titanium thickness for several process cases with and without the use of a refractory metal according to the present invention. The data indicated as a standard film was formed without a refractory metal and without a second phase transformation anneal. The $TiSi_2$ films corresponding to the data point for W, and the data for Mo were formed by a 600° C. anneal for 30 minutes in $N_2$ on (100) single-crystal silicon according to the present invention. An optional 5 second, 1000° C., RTA anneal was used following the implantation of the refractory metal (used for both W and Mo). The optional anneal is necessary when the $TiSi_2$ film is formed at about 600° C., but is not necessary for a formation temperature of about 700° C. The sheet resistance for each film is indicated by the data points in the graph.

Figure 5:
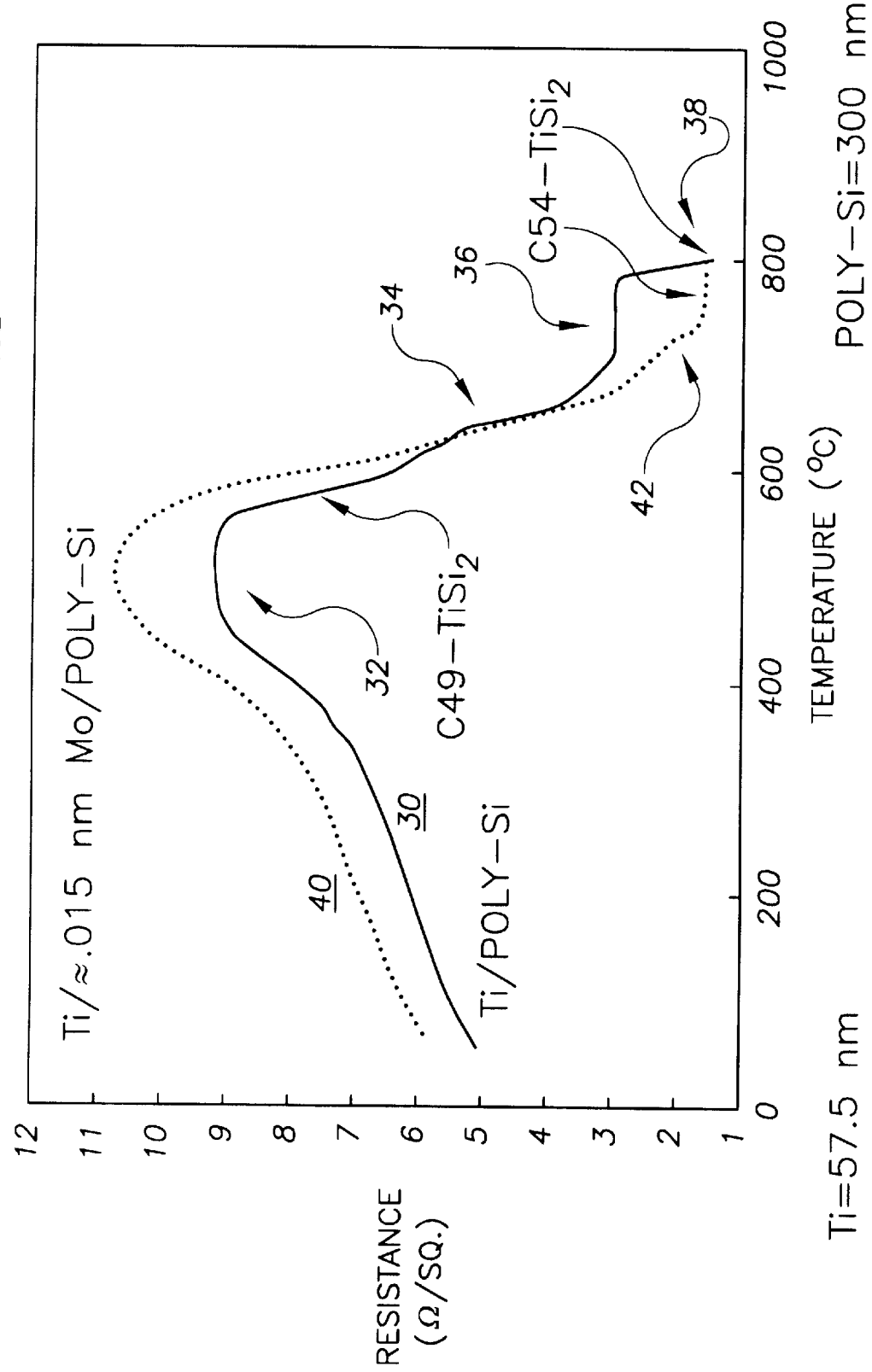
FIGS. 5–8 are in-situ scanning resistance graphs illustrating the sheet resistance of titanium silicide layers being formed for several process cases with and without the use of an evaporated or implanted refractory metal according to the present invention.
Figure 6:
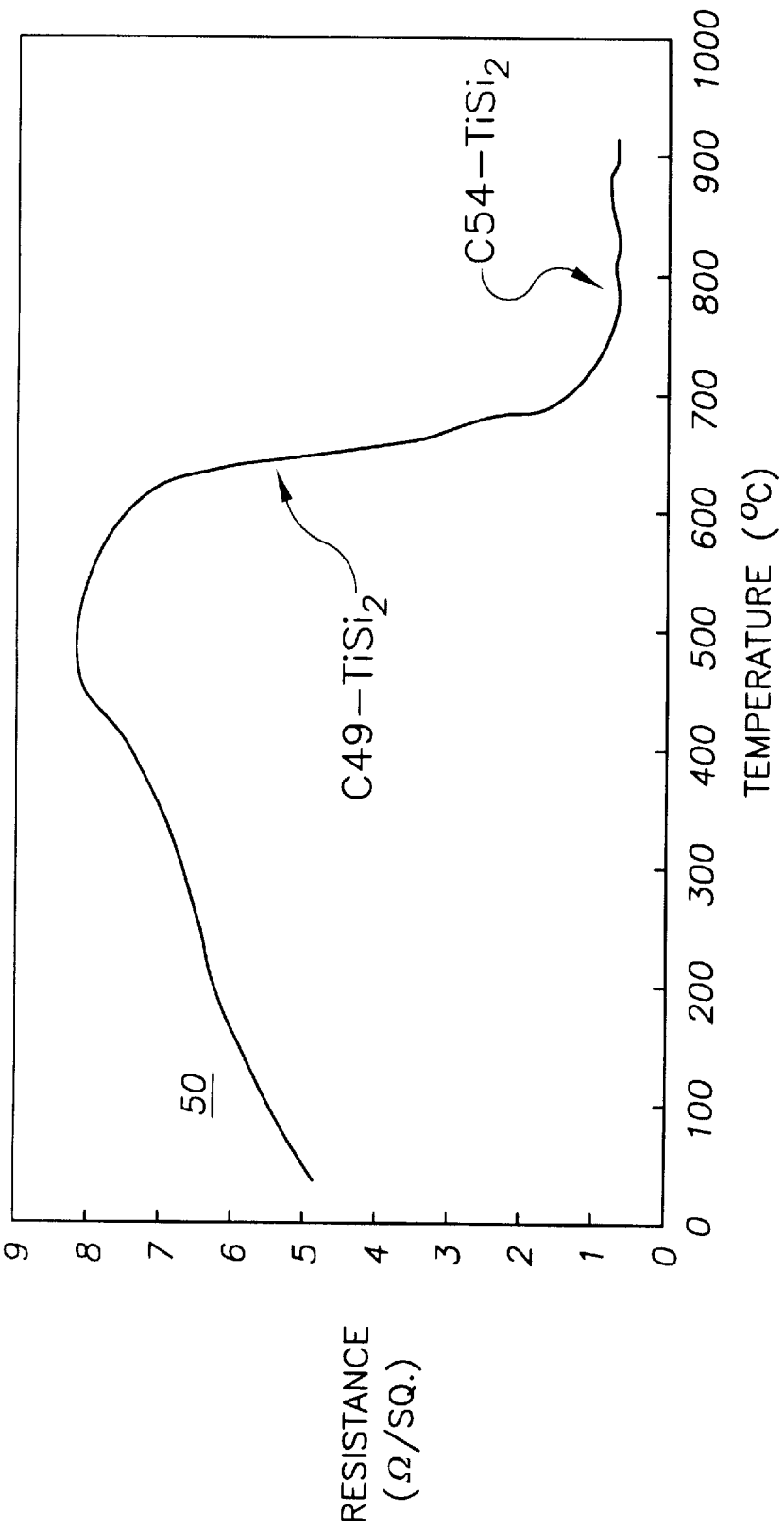
Figure 7:
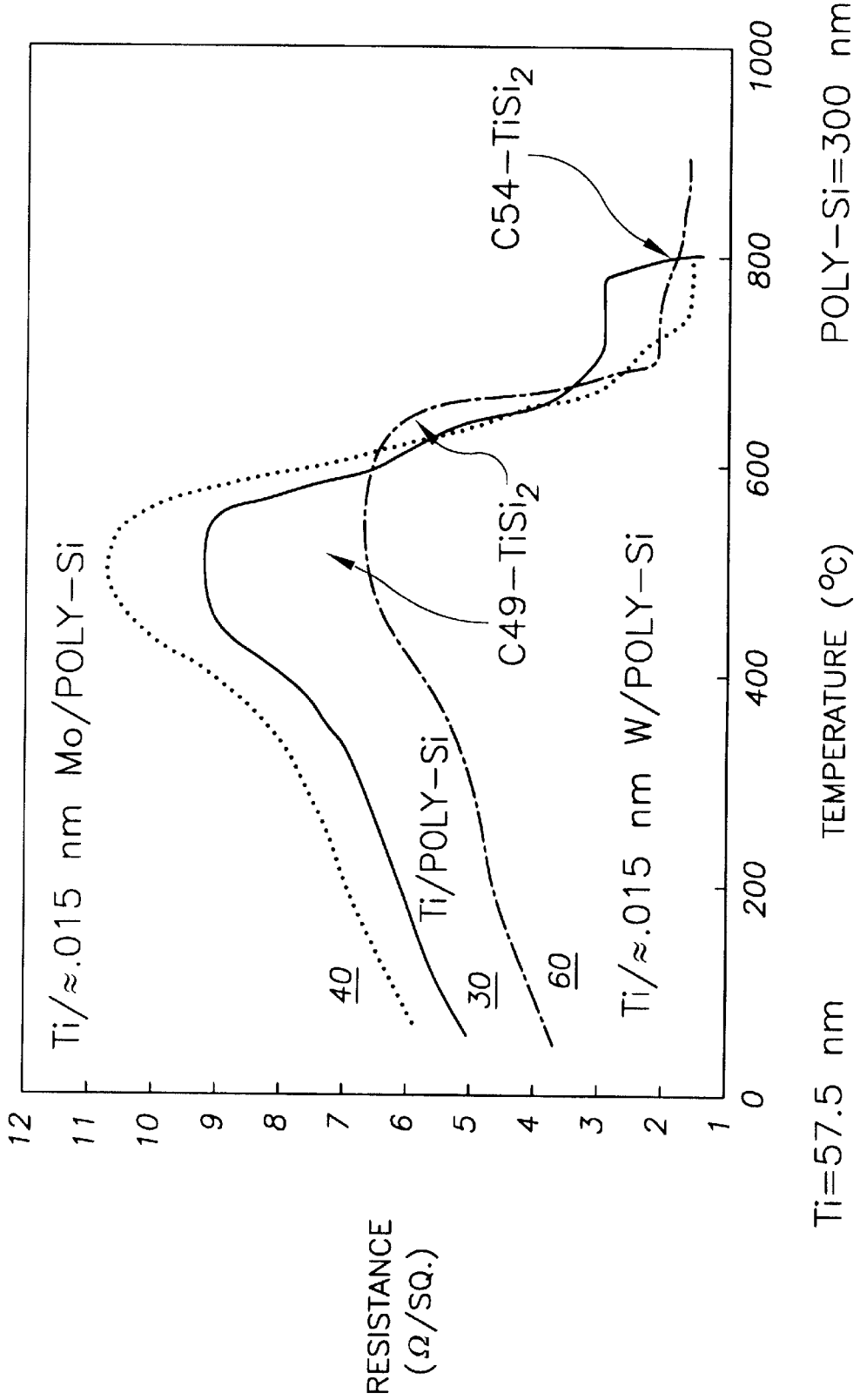
Figure 8:
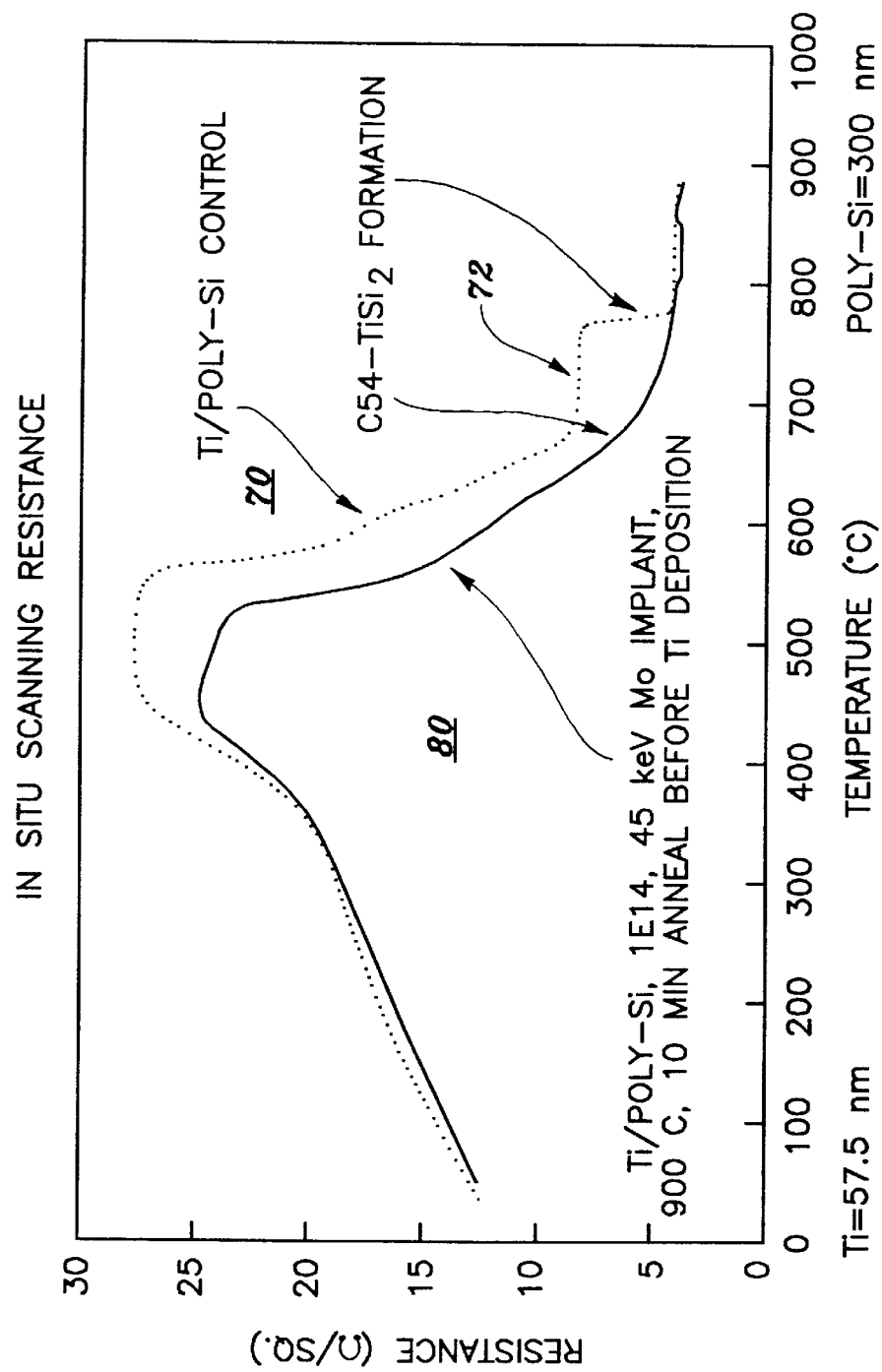

FIGS. 5–7 are in-situ scanning resistance graphs illustrating the sheet resistance of titanium silicide layers being formed for several process cases both with and without the use of an evaporated refractory metal according to the present invention. These measurements were made by continuously placing a four-point probe within a furnace during the formation of the $TiSi_2$ films. The refractory metal in FIGS. 5–7, where used, was disposed by the "flash" evaporation method described above. FIG. 8 is an in-situ scanning resistance graph for $TiSi_2$ films where an implanted, rather than evaporated, refractory metal was used. Common conditions for FIGS. 5–8 include the formation of a silicide film from a Ti layer of about 57.5 nm thickness previously deposited over an approximately 300 nm polysilicon layer. Each silicide film was formed by gradually increasing temperature at about 15° C. per minute.

Looking now at FIG. 5, curve 30 shows sheet resistance behavior for a titanium silicide film formed without the use of a refractory metal. Curve 30 exhibits the known and expected resistance increase due to intermixing at about point 32, with curve 30 forming a resistance peak at about 500° C. Above about 500° C., its resistance drops as indicated by arrow 34. As the temperature moves from about 500° C. to about 700° C., the forming $TiSi_2$ film is substantially in the C49 phase. At about 700° C. curve 30 flattens out into a so-called "knee" at point 36 in which the resistance is substantially constant with increasing temperature. This "knee" results from the failure of the silicide film to convert from the C49 phase to the C54 phase until even higher temperatures are reached. In contrast to curve 30, curve 40 illustrates resistance for a silicide film formed following the disposition of about 0.015 nm of Mo according to the present invention. Behavior is similar, but note that the "knee" observed for curve 30 above is substantially not present for curve 40 (see point 42). It is believed that the absence of this knee indicates that the C54 phase of $TiSi_2$ is directly formed to a substantial degree during silicidation without passing through the C49 phase.

In FIG. 6, curve 50 shows sheet resistance behavior for a forming silicide film where about a 0.015 nm Ta layer was disposed by flash evaporation according to the present invention. As for curve 40 in FIG. 5, no significant knee is observed during the formation of the C54 phase of $TiSi_2$. In FIG. 7, curve 60 illustrates sheet resistance versus temperature for a $TiSi_2$ film formed using about 0.015 nm of W according to the present invention. Curves 30 and 40 are shown for comparison with curve 60. Again, for curve 60 there is no significant knee and the C54 phase is substantially formed at a temperature less than about 700° C.

FIG. 8 is an in-situ scanning resistance graph illustrating the sheet resistance of a titanium silicide layer formed using an implanted refractory metal according to the present invention. Curve 70 is a control silicide film formed without a refractory metal, for comparison purposes, and curve 80 is a $TiSi_2$ film formed where Mo has been implanted (at a dosage of $10^{14}$ atoms/cm$^2$ and an implant energy of 45 KeV) prior to depositing Ti. After implanting Mo, an annealing step was performed at 900° C. for 10 minutes also prior to depositing Ti. As for the conventional curve 30 above, curve 70 exhibits a knee at point 72, but curve 80 does not. The absence of a knee for curve 80 indicates that the C54 phase of $TiSi_2$ is substantially formed at temperatures below about 700° C.

Figure 9:
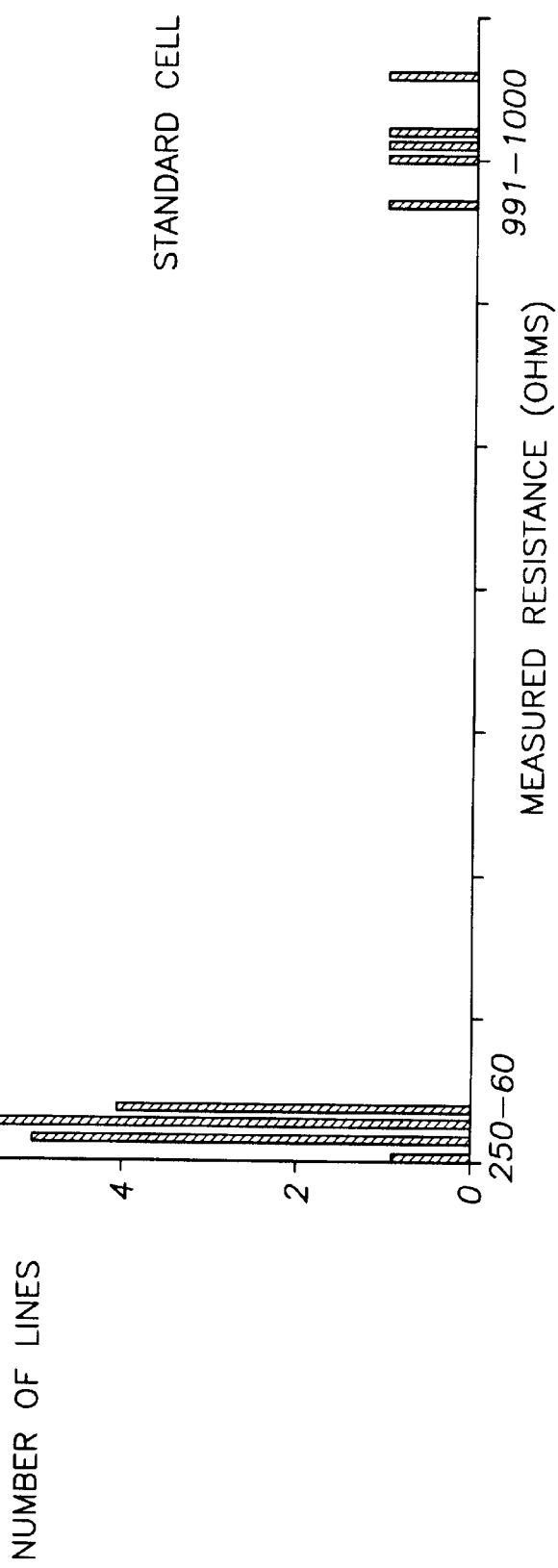
FIG. 9 is a histogram of the measured resistance of titanium silicide lines with and without a Mo ion implant according to the present invention.

FIG. 9 is a histogram of the measured resistance of titanium silicide lines with and without a Mo ion implant according to the present invention.

In addition to the data presented in FIGS. 4–9 above, there is further support that the C49 phase is substantially by-passed in silicidation by the present invention. Optical micrographs of the C54 phase of titanium silicide layers formed according to the present invention have indicated a grain size significantly smaller than in the conventional case without a refractory metal. This supports that the nucleation energy barrier of the C54 phase is significantly reduced by the method of the present invention. This becomes most important in VLSI circuits where the line widths are less than the grain size of the C54 phase that would be formed if using the conventional approach.

Although it is believed that the method according to the present invention described above is fairly robust, there are some precautions to its use. First, heat cycles above 700° C. for extended periods should be avoided when using the present invention to prevent possible silicide instability problems. Second, if the thickness of the refractory metal layer is too great, then delamination of the silicide may result.

Another advantage of the present invention is that it does not create an amorphous silicon layer at the top surface of the silicon layer. Specifically, when using the ion implantation method to dispose the refractory metal, the optional annealing step removes any amorphous silicon that may be present. The optional anneal is not necessary with the other manners of disposition in order to avoid amorphous silicon. It is desirable to avoid the presence of amorphous silicon because it has been associated with junction leakage failures.

In an alternative embodiment of the present invention, a metal silicide may be formed in a layer overlying a silicon layer on a semiconductor wafer by a method comprising depositing a layer of titanium alloy, which contains a refractory metal, over the silicon layer and heating the wafer to a temperature sufficient to substantially form C54 phase titanium silicide from the titanium alloy layer, where the phase transformation temperature of the titanium alloy is lowered by the presence of the refractory metal. Preferably the temperature for forming C54 phase is less than about 700° C.

Figure 10:
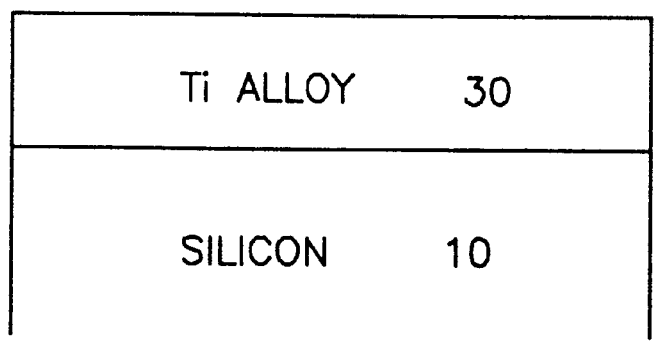
FIGS. 10 and 11 are cross-sectional side views illustrating the formation of C54 phase titanium silicide in accordance with one aspect of the present invention.

Referring to FIGS. 1 and 10, a titanium alloy layer 30 may be deposited over the surface of a silicon substrate 10. The silicon substrate 10 may itself overly other electronic components or may itself comprise a portion of such components, however, these aspects of the semiconductor device have not been shown in order to more clearly show and describe the aspects of the present invention. As used herein the term "electronic components" is intended to include both passive electronic elements and active electronic devices. The titanium alloy layer may comprise titanium and up to 20 atomic percent refractory metal, examples being Ta, Nb, Mo, W, V, Cr or combinations thereof. Ta and Nb are preferred refractory metals. In addition to the refractory metal, Si may also be incorporated into the titanium alloy layer. One skilled in the art will appreciate that the embodiment in which silicon is added to the titanium alloy layer may inhibit the use of self-aligned silicide processing techniques. In addition to the refractory metal, the titanium alloy layer may also incorporate other elements from the periodic table groups IIIA, IVA, VA and VIA, including B, C, N, O, Al, P, In, Sb and As. Group VIIA elements, such as F, are to be avoided, but if present, should be present in levels well below the atomic percent of the refractory metal.

The titanium alloy layer may be disposed by any one of several techniques known in the art. The titanium and the refractory metal may be deposited from different sources or a source of titanium which also contains a small quantity of a refractory metal, such that the atomic percentage of the refractory metal layer in the resulting layer is less than 20 atomic percent, preferably between 1–15 atomic percent. The titanium alloy may be deposited over the silicon substrate by the physical vapor deposition (PVD) process of sputtering. For example, a sputtering target of the appropriate titanium alloy is prepared such that when the film is deposited on a silicon substrate it has the desired atomic percentage of refractory metal. Alternatively, the PVD process of evaporation may be utilized to dispose the titanium alloy, in which the titanium and the refractory metal are deposited from two different sources at the appropriate rates to achieve the desired atomic percent of the refractory metal. Either of the above processes, as well as other processes known in the art for depositing titanium or metal silicides, may be used to dispose a layer of the titanium alloy over the silicon substrate. The titanium alloy layer may be disposed having a thickness of 10 to 200 nm, preferably a 10 to 60 nm layer.

Figure 11:
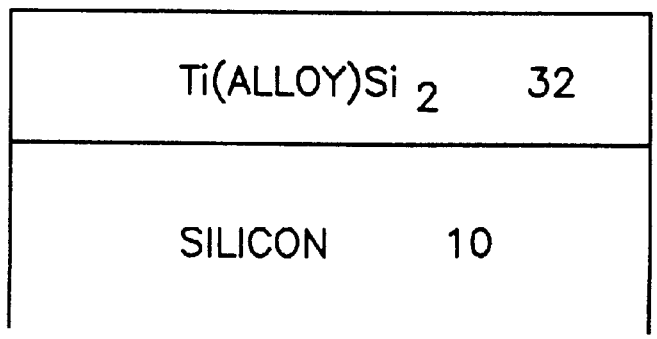

Referring to FIGS. 10 and 11, the titanium alloy layer 30 may then be heated to a temperature sufficient to form a layer of substantially C54 phase titanium silicide 32. As used herein, the phrase "substantially C54 phase" means a titanium silicide layer in which the resistance characteristics are dominated by the C54 phase and comprising at least 50% by weight C54 phase. As discussed in greater detail herein below, an advantage of the present invention is that a phase transformation annealing step may be eliminated as the C54 phase may b e substantially formed directly during the titanium silicide formation step, avoiding the need of a second phase "conversion anneal". Moreover, due to the presence of the refractory metal within the titanium silicide the thermal degradation temperature, the temperature at which undesirable transformations such as agglomeration may occur, is substantially increased. Raising the thermal degradation temperature has the benefit of creating a larger process window.

Figure 12:
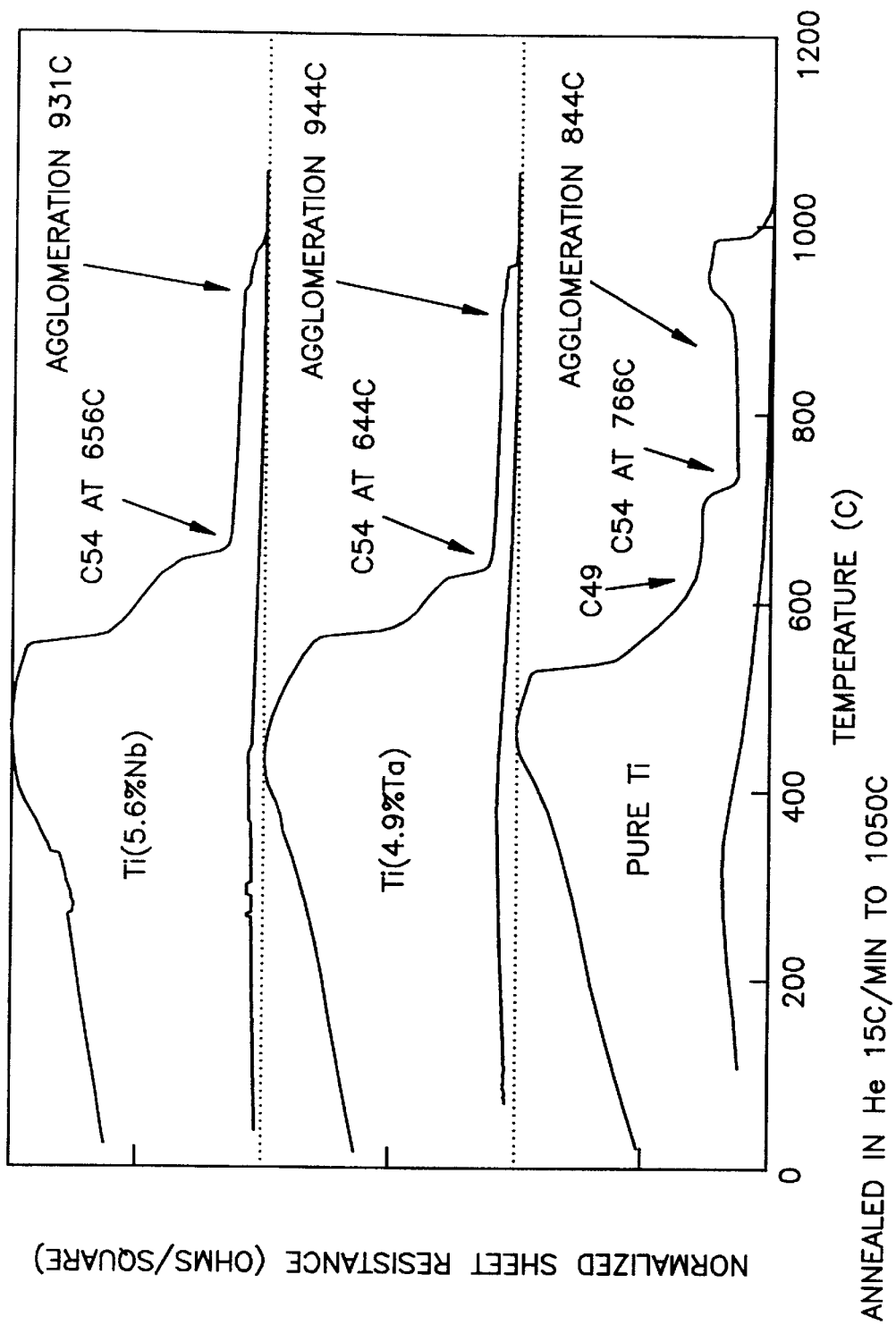
FIG. 12 is a graph depicting the normalized sheet resistances versus temperature for the formation of titanium silicide from pure Ti, Ti (tantalum) alloy, and Ti (niobium) alloy.

As shown in FIG. 12, an in-situ scanning resistance plot illustrates the decreased temperature of formation of titanium silicide having refractory metals therein relative to the temperature of formation of pure titanium silicide. This figure also shows that the thermal stability increases when the refractory metal is employed. The titanium layers referred to in FIG. 12 were each annealed to a temperature of 1050° C. (15° C./minute) in a He atmosphere.

Figure 13:
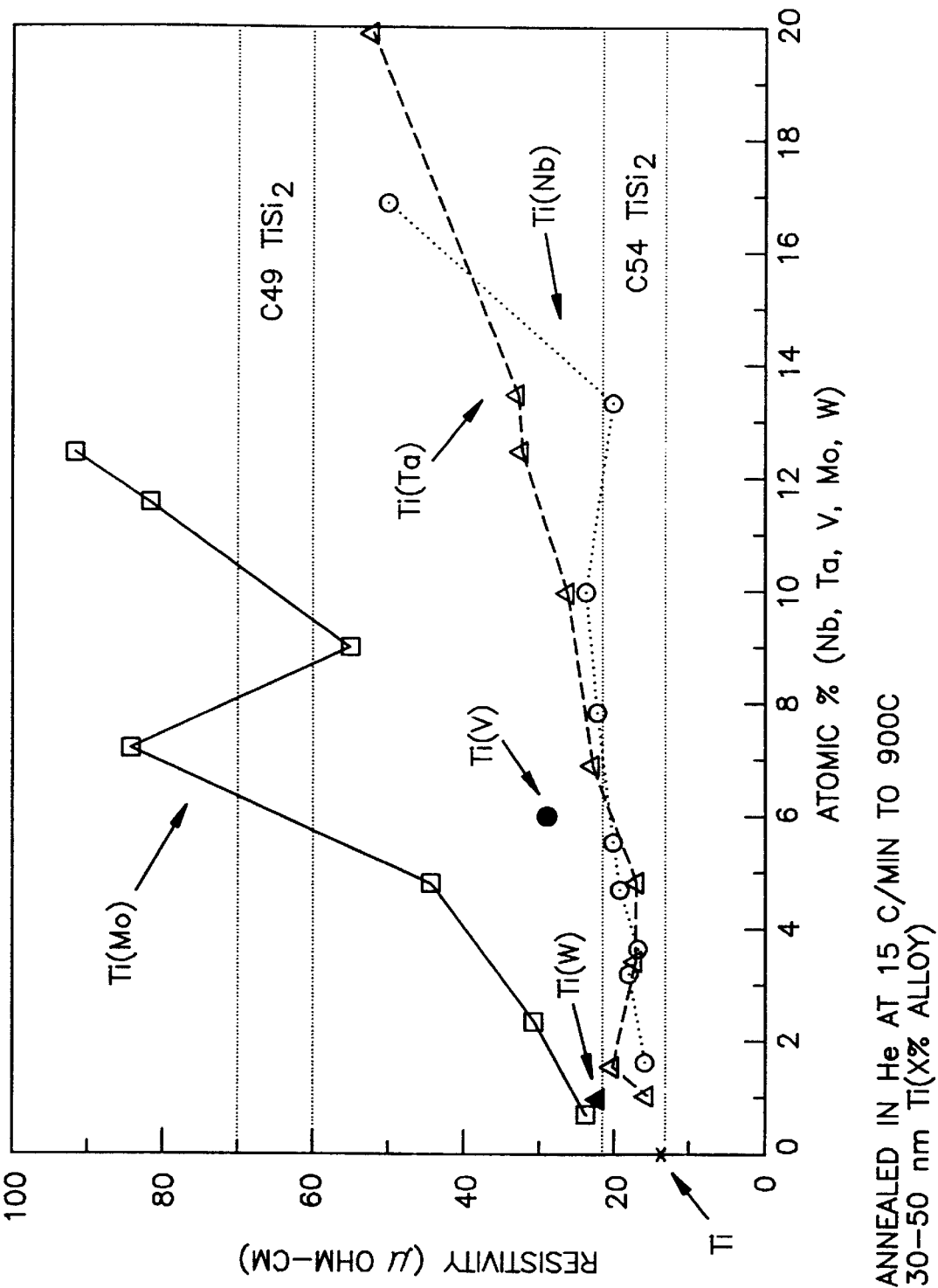
FIG. 13 is a graph depicting the resistivity of a titanium silicide layer annealed at 900° C. versus/atomic percent of refractory metal.
Figure 14:
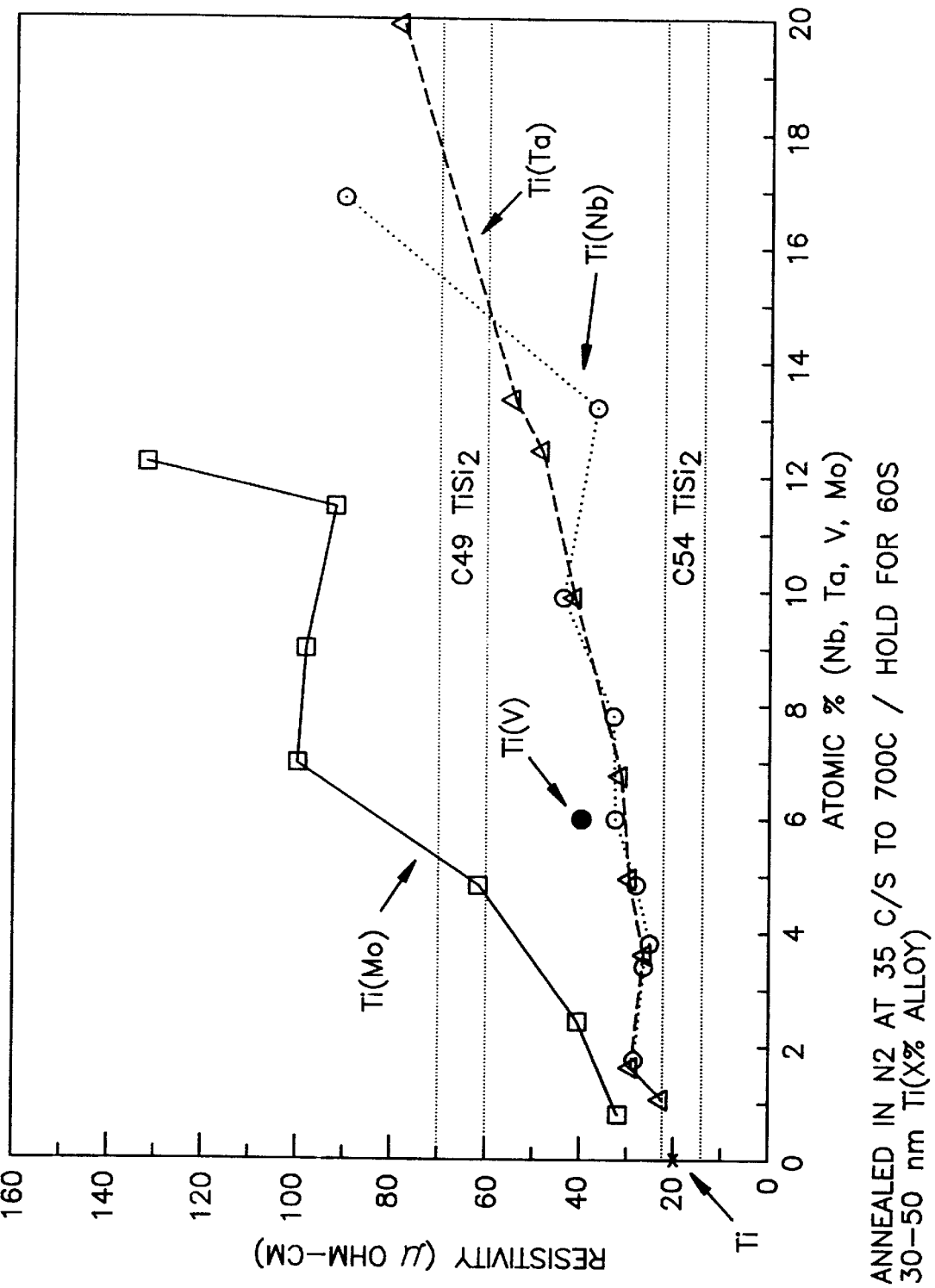
FIG. 14 is a graph depicting the resistivity of a titanium silicide layer annealed at 700° C. versus atomic percent of refractory metal.
Figure 15:
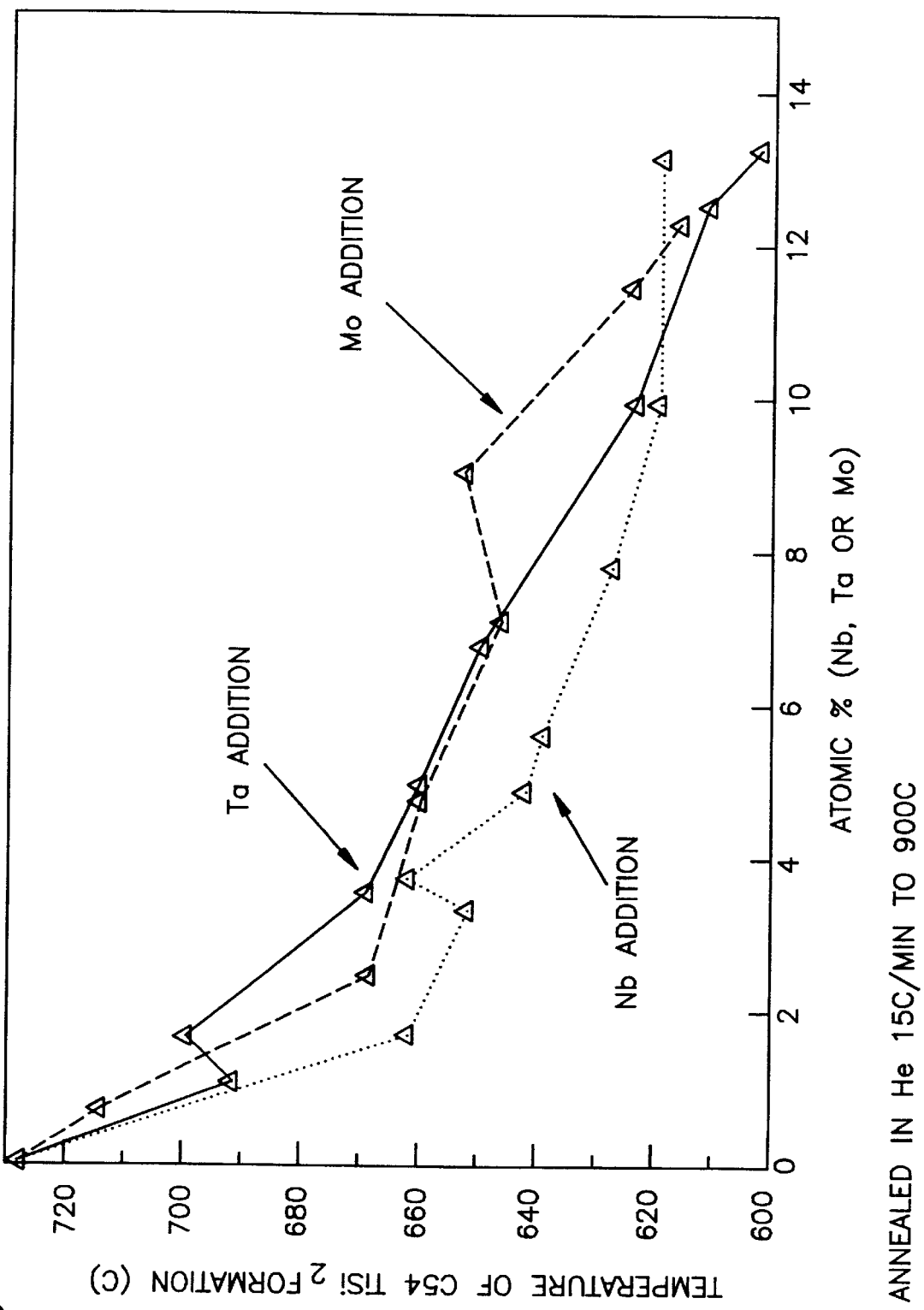
FIG. 15 is a graph depicting the formation temperature of C54 titanium silicide versus atomic percent of refractory metal.

FIG. 13 shows resistivity as a function of atomic percent of the refractory metal present within the titanium alloy used to form the titanium silicide. The titanium alloys were annealed to 900° C. (15° C./min.) in a He atmosphere. The region of the figure enclosed by the dotted lines entitled "C49 $TiSi_2$ and C54 $TiSi_2$" mark the standard resistivity range for C49 phase and C54 phase $TiSi_2$ formed from pure $TiSi_2$. This figure illustrates that the annealed titanium alloys of the present invention with 1–20 atomic % refractory metal have resistances well below C49 phase $TiSi_2$. However, titanium alloys formed with Mo exhibit decreased resistivity at concentrations below about 5 atomic %. In addition, FIG. 14 similarly shows resistivity as a function of atomic percent of the refractory metal present within the titanium alloy used to form the titanium silicide. However, in FIG. 14 the anneal was performed on a 30–50 nm titanium alloy layer in an $N_2$ atmosphere at 700° C. (35° C./S held for 60 seconds). FIGS. 13 and 14 show that the titanium suicides formed from titanium alloys incorporating Ta, Nb, Mo, W and V each exhibit resistances well below C49 phase titanium silicide. FIG. 15 further shows the temperature of C54 formation as a function of atomic percent of the refractory metal added to the titanium alloy. FIGS. 14 and 15 both show that the annealed titanium alloys of the present invention have resistances comparable to C54 phase $TiSi_2$ formed from pure $TiSi_2$ and that they achieve these low resistances at considerably lower temperature anneals.

Figure 16:
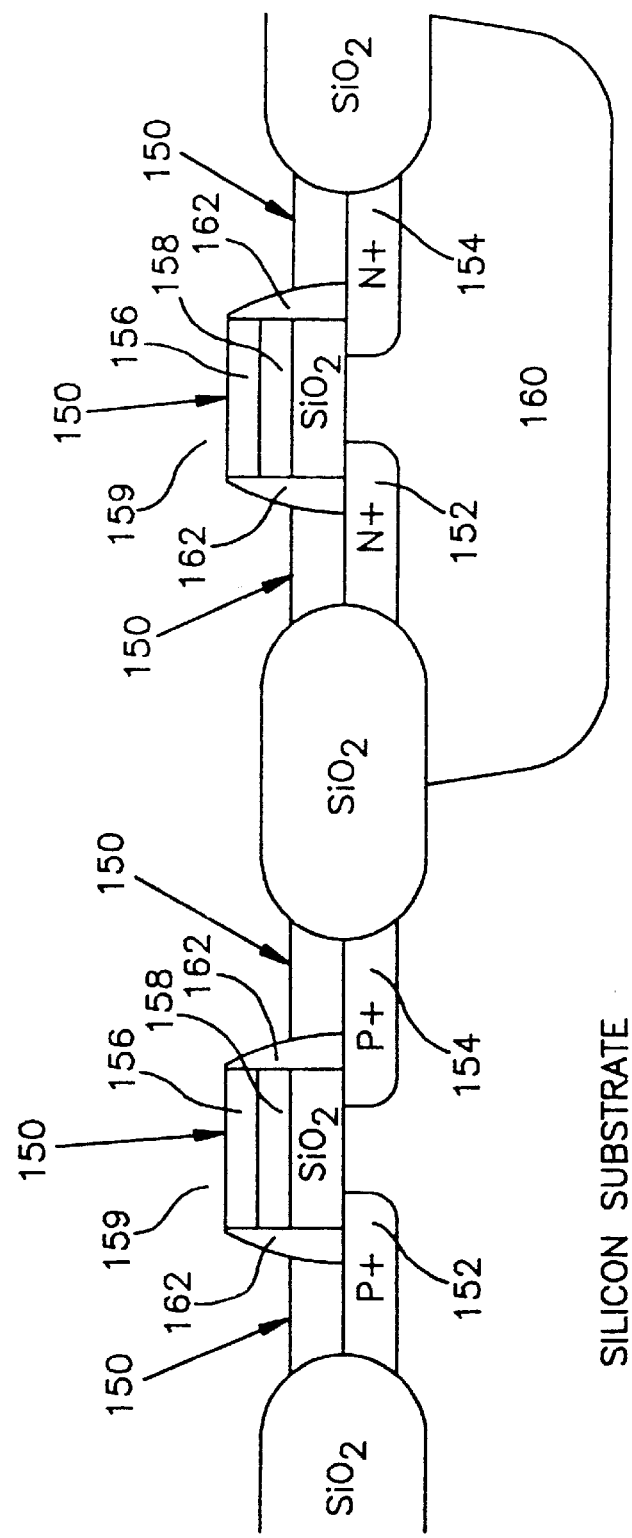
FIG. 16 is a cross-sectional side view of a portion of a semiconductor device incorporating low resistivity titanium suicides of the present invention.

The process of the present invention may be readily integrated into present semiconductor fabrication techniques employing titanium silicide layers formed from pure titanium. For example, in reference to FIG. 16, a CMOS transistor is shown employing titanium silicide layers 50 of the present invention as the source 52, drain 54 and gate contacts 56 on both N-MOSFET and P-MOSFET devices. However, the titanium suicides of the present invention may used in conjunction with the fabrication processing techniques of numerous other electronic components.

Titanium alloy, comprising titanium and a refractory metal, may be deposited over the device, including the polysilicon layer 58 and over the highly doped silicon of the source 52 and drain 54 regions as would pure titanium in present self-aligned silicide applications. After deposition, the titanium alloy may be initially heated, in a "formation anneal", at low temperatures to form titanium silicide. Since C54 phase titanium silicide may be formed from the titanium alloy at significantly lower temperatures than other silicidies, the formation anneal may form a substantially C54 phase titanium silicide layer. Thus, in many instances, when using the titanium alloy, the need for the conversion anneal may be entirely dispensed with as C54 phase titanium silicide may be substantially formed with the first low temperature anneal. However, depending on the formation anneal temperature and geometry of the device, a conversion anneal may still be necessary in some applications.

The titanium silicide whether C49 phase, C54 phase or a mixture of the two, may then be selectively etched in accordance with present processing techniques removing unreacted portions of the titanium alloy layer. This process is generally referred to as a "salicide" or self-aligned silicide process since those areas of the titanium alloy which are not positioned over a silicon substrate do not react to form a silicide and may be "self-aligned" by etches that selectively etch metals relative to suicides. After etching, the C49 phase titanium silicide or titanium silicides having a mixture of C49 and C54 phase may be subjected to a second anneal, the "conversion anneal", which transforms the silicide into the desired substantially C54 phase titanium silicide. However, even in those instances where a conversion anneal is necessary or desired, the conversion anneal may be performed at considerably lower temperatures, thereby conserving the available thermal budget. After formation of the low resistivity titanium silicide layers of the present invention the electronic components and the desired interconnects may be completed employing well known semiconductor fabrication techniques.

With pure titanium silicide the formation anneal forms the C49 phase titanium silicide. The formation anneal is necessarily completed at low temperatures, which cannot form C54 phase from pure $TiSi_2$, in order to avoid the formation of silicide over unwanted regions of the device, a problem commonly referred to as bridging. For example, in the device of FIG. 16 subjecting the device to temperatures necessary to form C54 phase titanium silicide from pure titanium prior to selectively etching unwanted portions of the titanium layer may cause the formation of silicide over the oxide spacers 62. Formation of suicides over the spacers 62 would electrically connect the gate 59 and source 52 or drain 54 regions thereby shorting the device. Therefore, existing silicide processing techniques must employ a second high temperature anneal, a conversion anneal, to convert the C49 phase titanium silicide to the desired low resistivity C54 phase after etching the unreacted portions of the titanium. Thus, it is of particular importance that a layer of low resistivity titanium silicide, substantially C54 phase, may be formed by heating the device with the titanium alloy in a single formation anneal or in a conversion anneal at temperatures significantly below 900° C. As indicated above, formation of the C54 phase from a titanium alloy is advantageous in that it will cause less migration of dopant materials comprising the pre-defined doped regions 58 and 60 of individual electronic components.

Although the present invention has been described in detail above, it is not intended to be limited to the specific form set forth herein, and is intended to cover such alternatives and equivalents as can reasonably be included within the spirit and scope of the invention as defined by the appended claims.

We claim:

1. A method of forming a titanium suicide layer on a silicon substrate of a semiconductor device, comprising:
    disposing a titanium alloy layer over the silicon substrate wherein said titanium alloy comprises from 1 to 20 atomic percent refractory metal; and
    heating said titanium alloy to a temperature of less than about 700° C. sufficient to substantially form C54 phase titanium silicide.

2. The method of claim 1 wherein said substrate is heated to a temperature sufficient to completely transform said titanium alloy layer to C54 phase titanium silicide.

3. The method of claim 1 wherein said refractory metal comprises one or more elements of the group consisting of Ta, Nb, W, V and Cr.

4. The method of claim 1 wherein said titanium alloy comprises from 1 to 15 atomic percent refractory metal.

5. The method of claim 4 wherein said refractory metal comprises a refractory metal selected from the group consisting of Ta and Nb.

6. The method of claim 1 wherein said titanium alloy comprises titanium, silicon and a refractory metal.

7. The method of claim 1 wherein said titanium alloy layer is disposed 10 to 60 nm thick over said silicon substrate.

8. The method of claim 1 wherein said silicon substrate is selected from the group consisting of monocrystalline silicon, polycrystalline silicon, amorphous silicon, and a silicon germanium alloy.

9. The method of claim 1 wherein said silicon substrate is selected from the group of silicon on insulator containing N-type dopant and silicon on insulator containing P-type dopant.

10. The method of claim 1 wherein said titanium alloy is deposited over said silicon substrate by physical vapor deposition.

11. The method of claim 1 wherein said titanium alloy is deposited over said silicon substrate by chemical vapor deposition.

12. The method of claim 1 wherein said titanium alloy comprises 1 to about 5 atomic percent Mo.

13. A method of forming a titanium silicide layer in a semiconductor device, comprising:

depositing a 10 to 200 nm titanium alloy layer over a semiconductor device, wherein said titanium alloy comprises from 1 to 15 atomic percent refractory metal and said semiconductor device incorporates a plurality of electronic components having exposed silicon surfaces;

heating said titanium alloy layer to a temperature sufficient to substantially form C54 phase titanium silicide in the titanium alloy layer overlying said silicon surfaces, said temperature being less than about 700° C.; and etching unreacted portions of said titanium alloy layer.

14. A method of forming a titanium silicide layer in a semiconductor device, comprising:

depositing a 10 to 200 nm titanium alloy layer over a semiconductor device, wherein said titanium alloy comprises from 1 to 15 atomic percent refractory metal and said semiconductor device incorporates a plurality of electronic components having exposed silicon surfaces;

heating said titanium alloy layer sufficient to form titanium silicide m the titanium alloy overlying said silicon surfaces;

etching unreacted portions of said titanium alloy; and heating said titanium silicide to a temperature sufficient to substantially form C54 phase titanium silicide, said temperature being less than about 700° C.

\* \* \* \* \*